United States Patent
Etcheberry et al.

(10) Patent No.: US 11,043,390 B2
(45) Date of Patent: Jun. 22, 2021

(54) MASK FOR PROTECTING A SEMICONDUCTOR MATERIAL FOR LOCALIZED ETCHING APPLICATIONS

(71) Applicant: Centre National De La Recherche Scientifique, Paris (FR)

(72) Inventors: Arnaud Etcheberry, Colombes (FR); Anne-Marie Goncalves, Marly-le-Roi (FR); Jean-Luc Pelouard, Paris (FR); Mathieu Fregnaux, Montigny-le-Bretonneux (FR); Anais Loubat, Puteaux (FR)

(73) Assignee: Centre National De La Recherche Scientifique, Paris (FR)

( * ) Notice: Subject to any disclaimer, the term of this patent is extended or adjusted under 35 U.S.C. 154(b) by 0 days.

(21) Appl. No.: 16/633,028

(22) PCT Filed: Jul. 31, 2018

(86) PCT No.: PCT/EP2018/070687
§ 371 (c)(1),
(2) Date: Jan. 22, 2020

(87) PCT Pub. No.: WO2019/025418
PCT Pub. Date: Feb. 7, 2019

(65) Prior Publication Data
US 2020/0211855 A1    Jul. 2, 2020

(30) Foreign Application Priority Data
Jul. 31, 2017 (FR) .......................... 1757294

(51) Int. Cl.
*H01L 21/308* (2006.01)
*H01L 21/306* (2006.01)

(52) U.S. Cl.
CPC ...... *H01L 21/3081* (2013.01); *H01L 21/3086* (2013.01); *H01L 21/30604* (2013.01)

(58) Field of Classification Search
CPC ........... H01L 21/3081; H01L 21/30604; H01L 21/3086; H01L 21/467; H01L 21/02247;
(Continued)

(56) References Cited
U.S. PATENT DOCUMENTS

2004/0087176 A1* 5/2004 Colburn .............. H01L 21/0331
438/758
2004/0253467 A1* 12/2004 Schussler ................ A61L 27/06
428/474.4
(Continued)

FOREIGN PATENT DOCUMENTS

WO    WO-2016048336 A1 *  3/2016  ....... H01L 29/42392

OTHER PUBLICATIONS

Concalves et al, Fully Protective yet Functionalizable Monolayer on InP, Chemistry of Materials, 2010, No. 22, pp. 3114-3120.
(Continued)

*Primary Examiner* — Anita K Alanko
(74) *Attorney, Agent, or Firm* — Zaretsky Group PC; Howard Zaretsky

(57) ABSTRACT

The invention relates to the chemical etching of a semiconductor material, including:
deposition at least one mask (PLP) on a first surface zone of a semiconductor material (SC); and
chemically etching (S31) a second surface zone of the semiconductor material (SC) that is not covered by the mask (PLP).
In particular, the aforementioned mask is produced in a material including polyphosphazene, which material protects the underlying semiconductor especially well.

9 Claims, 3 Drawing Sheets

Figure 1A:
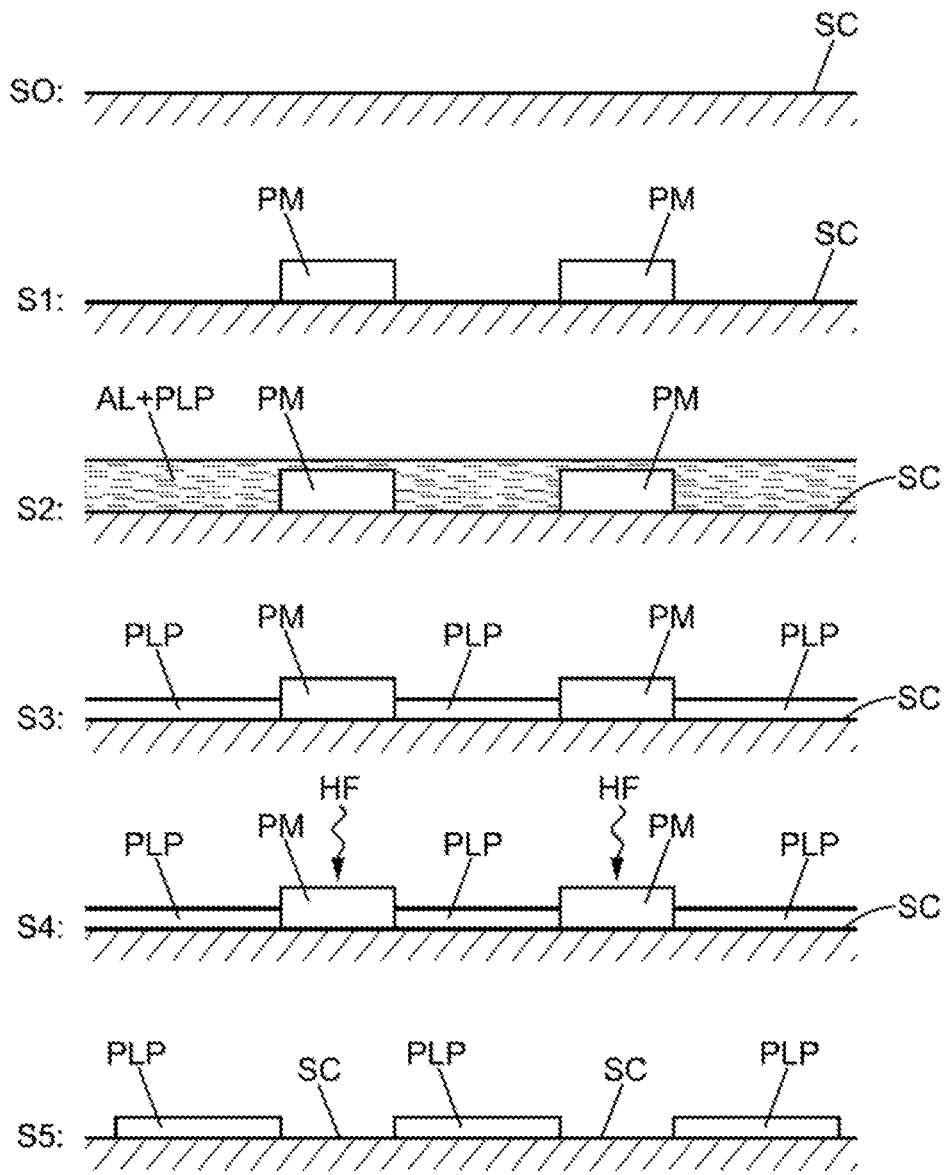

(58) Field of Classification Search
CPC ......... H01L 21/02258; H01L 21/02282; H01L 21/30612
See application file for complete search history.

(56) References Cited

U.S. PATENT DOCUMENTS

| | | | |
|---|---|---|---|
| 2007/0210459 A1* | 9/2007 | Burrows | H01M 2/08 257/790 |
| 2009/0200633 A1* | 8/2009 | Chapman | H01L 27/1463 257/466 |
| 2015/0108617 A1 | 4/2015 | Etcheberry et al. | |

OTHER PUBLICATIONS

Etsuko Inamura et al., "Wet Chemical Etching for Ultrafine Periodic Structure: Rectangular InP Corrugations of 70 nm Pitch and 100 nm Depth", Japanese Journal of Applied Physics, Japan Society of Applied Physics, JP, vol. 28, No. 10, Part 01, Oct. 1, 1989 (Oct. 1, 1989), pp. 2193-2196, XP000083678.

A.-M. Goncalves et al., "First evidence of stable P—N bonds after anodic treatment of InP in liquid ammonia: A new III-V material passivation route", Electrochemistry Communications, Elsevier, Amsterdam, NL, vol. 10, No. 2, Nov. 24, 2007 (Nov. 24, 2007), pp. 225-228, XP022438574.

H. Hiraoka, "Aryloxy-poly(phosphazenes) as negative-working, oxygen reactive ion etching resistant resist materials", Journal of Vacuum Science & Technology B: Microelectronics Processing and Phenomena, vol. 5, No. 1, Jan. 1, 1987 (Jan. 1, 1987), pp. 386, XP055460971.

A.-M. Goncalves et al., "Electrochemical Comparisons between GaAs and InP in Liquid Ammonia regarding the Anodic Passivation Process", Journal of the Electrochemical Society, vol. 159, No. 2, Dec. 22, 2011 (Dec. 22, 2011), pp. C97-C100, XP055461214.

C. Njel et al., "An Attractive Wet Route for Nitriding III-Vs", ECS Transactions, vol. 66, No. 6, May 15, 2015 (May 15, 2015), pp. 89-94, XP055461208.

A. Causier et al., "Aqueous bromine etching of InP: a specific surface chemistry", Physica Status Solidi. C: Current Topics in Solid State Physics, vol. 9, No. 6, Apr. 18, 2012 (Apr. 18, 2012), pp. 1408-1410, XP055461837.

* cited by examiner

MASK FOR PROTECTING A SEMICONDUCTOR MATERIAL FOR LOCALIZED ETCHING APPLICATIONS

The present invention relates to the field of selective etching of materials such as semiconductors (in particular III-V or II-VI group semiconductors), and more specifically to masks used for carrying out such etching methods by means of chemical attack, ie chemical etching.

The technique involving chemical etch masks continues to be in need of improvement, in particular in terms of the quality of protection of the mask covering the parts of the semiconductor to be protected, in terms of the fineness of the resulting etching, and other relevant aspects.

The present invention serves to improve this situation.

To this end, the invention provides an etching method for etching by means of chemical attack—ie chemical etching—of a semiconductor material, the method including:
- deposition of at least one mask on a first surface zone of a semiconductor material, and
- chemical etching, ie by chemical attack, of a second surface zone of the semiconductor material that is not covered by the mask.

In particular, the mask is produced out of a material that comprises polyphosphazene.

This material, as illustrated by way of examples of embodiments provided here below, is particularly effective for the protection of the underlying materials, in particular semiconductors. Thus, the etching carried out in the second step of the method noted above may be carried out with very aggressive solutions despite which it has nevertheless been observed that, due to the highly effective protection of the mask, the etching remains particularly fine and extremely well defined, and therefore very localized in the zone that is not protected.

In one embodiment, the deposition of the mask comprises the controlled deposition of polyphosphazene by means of an electrochemical process, ie electrochemical deposition.

The deposition of the mask may include a process of immersion in liquid ammonia followed by the deposition of polyphosphazene.

By way of an alternative to electrochemical deposition, the deposition may take place simply without the use of electrical energy, according to a method referred to as "electroless". In the two cases, the method may then include the above-mentioned immersion in liquid ammonia (combined possibly with dissolved phosphorus pentachloride or "PCl5").

The deposition of a mask may in addition include:
- the deposition of at least one removable pre-mask on the said second surface zone of the semiconductor material;
- the deposition of polyphosphazene (by means of electrochemical process or spraying of liquid ammonia), and, with the polyphosphazene not adhering to the pre-mask;
- the simple removal of the removable pre-mask so as to expose the said second surface zone of the semiconductor material, in order to then carry out the actual etching operation itself.

For example, the pre-mask may be produced from a material based on silicon oxynitride $SiO_xN_y$.

The removable pre-mask may typically be removed by immersion in hydrogen fluoride solution.

In one embodiment as an alternative to the use of a pre-mask, the deposition of polyphosphazene may simply be etched by a beam in order to form the aforementioned mask covering the first zone.

The beam may be an electron beam or a laser beam.

The chemical attack on the semiconductor in regions that are not protected by the mask may be carried out by application of an oxidising etching solution (for example an "HBr" type solution described here below).

The present invention also relates to a protection mask for protecting a semiconductor material vis-à-vis a chemical etching, ie by chemical attack, where the mask is made of a material that comprises polyphosphazene.

Advantageously, this mask is thus then able to have a thickness of the order of only a few nanometers.

Figure 1B:
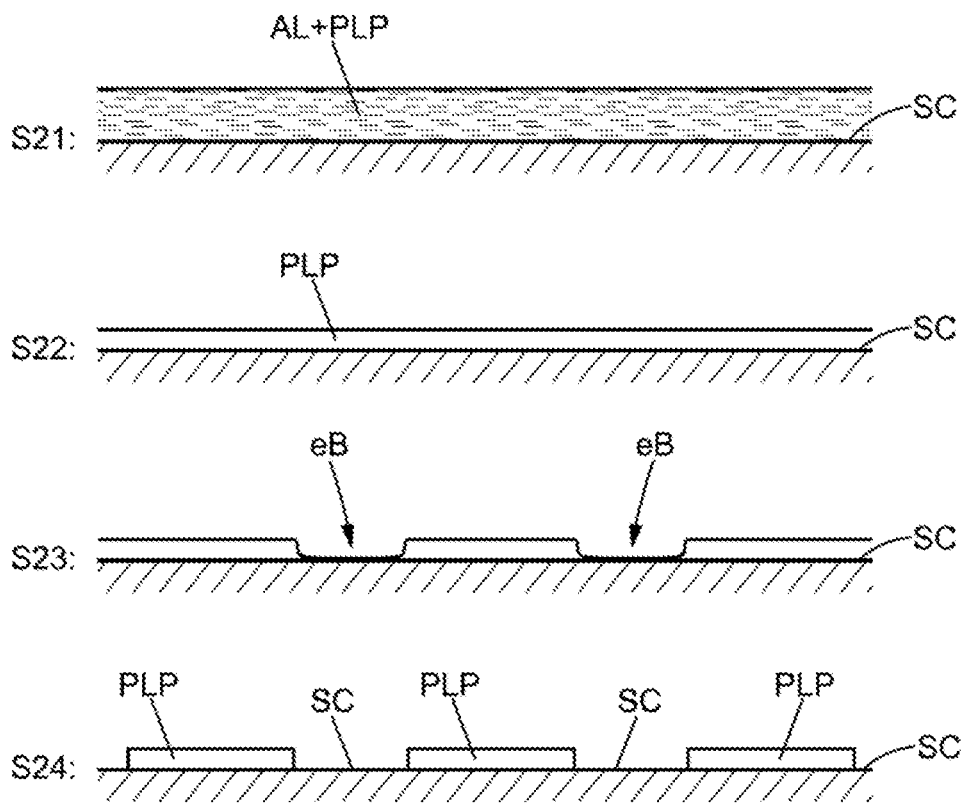
Figure 1C:
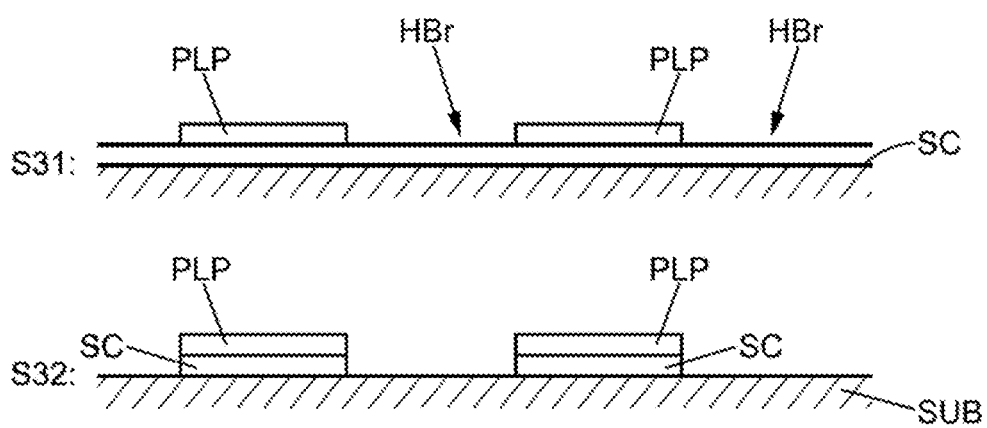
Figure 2:
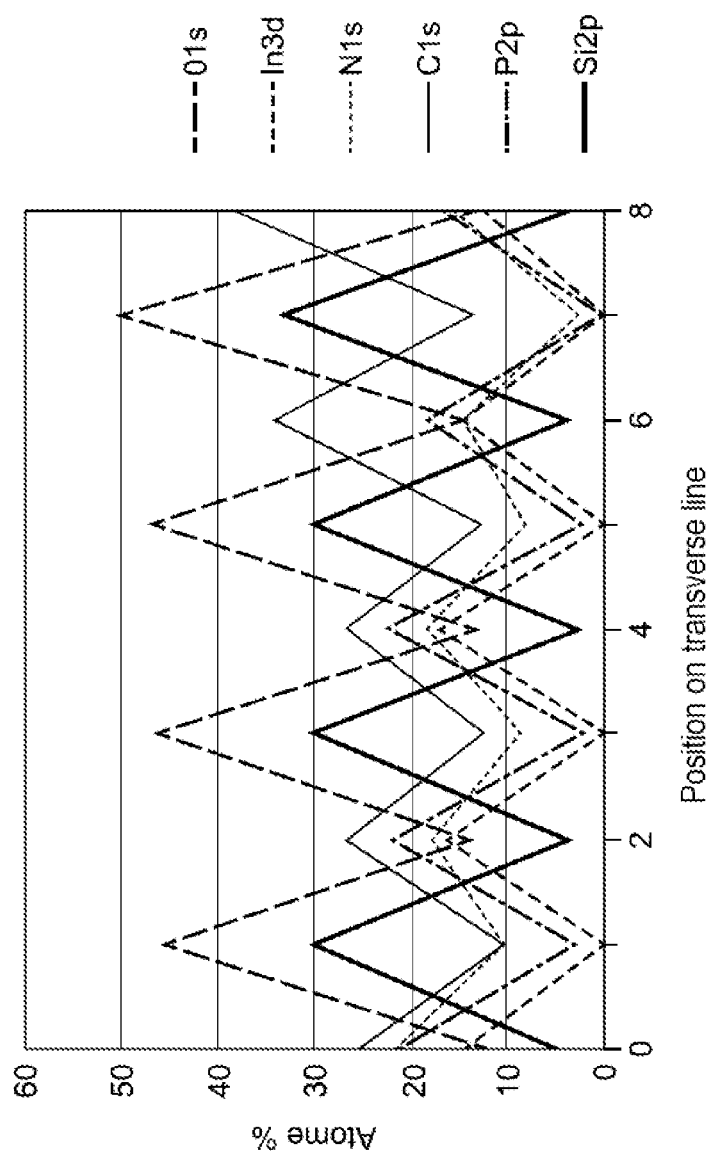

Other advantages and characteristic features of the invention will become apparent upon reading the detailed description of the non-limiting examples of embodiments, and upon reviewing the appended drawings in which:

FIG. 1A schematically illustrates the steps for depositing a polyphosphazene based mask in a first embodiment;

FIG. 1B schematically illustrates the steps for depositing the polyphosphazene based mask in a second, alternative embodiment;

FIG. 1C schematically illustrates the steps for etching of the semiconductor that is partially covered by the polyphosphazene-based mask in one or the other of the first and second embodiments mentioned above;

FIG. 2 represents the variations in the XPS (X-ray photoelectron spectroscopy for surface chemical analysis) signals for different atomic species, along a line comprising a succession of a plurality of masks covering an Indium Phosphide (InP) semiconductor in this example.

Polyphosphazene films have protective properties that protect against the chemical reactivity of surfaces of semiconductor materials. Polyphosphazene is an inorganic polymer (with no carbon atom) that comprises in particular a specific skeleton made of phosphorus and nitrogen. It is described in particular in the document: "Fully Protective yet Functionalizable Monolayer on InP" (Anne-Marie Gonçalves, Nicolas Mézailles, Charles Mathieu, Pascal Le Floch, Arnaud Etcheberry), Chemistry of Materials, 2010, No 22, p. 3114-3120.

These polyphosphazene films may be obtained either through an electrochemical process or without contact being brought about, by means of an "electroless" type method, for example in the liquid ammonia (in solution) added to PCl5.

The thicknesses obtained from polyphosphazene films are nanometric (for example between 2 and 10 nm) and it has been observed that such thicknesses are sufficient to ensure their protective function.

Ensuring the chemical inertness of the surfaces covered by this type of film is one of the primary protective capabilities of the film, in particular with regard to the re-oxidation of the surfaces due to their interaction with air (with oxygen, water vapour, or the like).

This primary protective capability has been tested over time periods of more than one year and the tests demonstrate the remarkable protective capabilities of this film. The behaviour of this type of film has been tested in the presence of oxidising aqueous solutions which generate a continuous dissolution of semiconductors. Due to this fact, these oxidising aqueous solutions can be used as an etching solution in wet etching technology in order to generate structures (referred to as "MESA" structures, or "in ribbons", or the like) on surfaces that are covered in advance with masking patterns delimited in this case by polyphosphazene film deposits defining the zones to be protected.

By way of an example that has given satisfactory results, a surface of III-V semiconductor alloy of such type as Indium Phosphide (InP) covered with a polyphosphazene film obtained by means of the "electroless" process was tested against an aqueous bromine solution (HBr/Br2), which could be acidic or neutral. On the surfaces of the semiconductor which were not covered with the polyphosphazene film, the aqueous solution triggers the dissolution of the InP semiconductor (of type n or p, the polarisation of the semiconductor having no effect thereon). The dissolution is remarkable and rapid for the concentrations used (several micrometers per minute).

On the other hand, the surfaces protected by the polyphosphazene film are observed to demonstrate total stability, relative to the phenomenon of particularly aggressive etching of aqueous di-bromine based solutions. The film has been found to be stable with respect to all of the acidic, neutral or basic solutions tested. This polyphosphazene masking capacity, for wet etching, is thus able to work effectively with all etching solutions for wet etching techniques for groups III-V or II-VI semiconductor materials.

Thus, it has been possible to observe the chemical stability of the surfaces of the semiconductor, covered by a passivation film based on polyphosphazene obtained by means of an electrochemical process or by means of an "electroless" process, vis-à-vis oxidising aqueous solutions that are capable of generating significant levels of dissolution (one or more μm/min) on surfaces of the semiconductor that are not protected by a conventional film (typically a silica film or more generally SiOx, or some other similar material) and is proposed herein in an industrial application for the selective etching of semiconductors.

In the example of the embodiment presented here with no loss of generality, the case of the group III-V semiconductor, of a type such as InP, both covered and not covered with a polyphosphazene film (for purposes of comparison), in the presence of an aqueous solution of $Br_2$ acid, shows that polyphosphazene may be used as a very effective protective mask for very aggressive chemical attacks which usually "encroach" on the zones that are protected by the mask. Thus, the use of polyphosphazene should make it possible to make use of very aggressive chemical solutions, whereas the masking continues to maintain a thickness of the order of a few nanometers. In addition, the protection afforded by polyphosphazene is very durable and thus improves the quality of components made from semiconductors over the duration of their operating or service life.

In this example of the embodiment, HBr acid or a background salt such as KBr is introduced into the etching solution in order to maintain the Br—/$Br_2$ couple at a constant level by offering the possibility of testing different levels of pH. Thus, the attack capabilities of the formulation remain constant over time at a level that is regulated by the concentration of Br2 (or (Br3)—in solution).

The unprotected surfaces of the semiconductor undergo aggressive dissolution by oxidative attack, which is thus constant over time.

On the other hand, the surfaces that are protected by the polyphosphazene film are completely spared from dissolution.

In fact, assays were carried out in solution in order to detect traces or "ultra-traces" of indium and phosphorus dissolved in solution by means of "ICP-OES" (Inductively Coupled Plasma-Optical Emission Spectrometry) with a detection threshold of around a few nm/cm² of surface area dissolved. The tests on the fully protected surfaces were compared to those on bare surfaces, with the same chemical formulation and the same experimental conditions (hydrodynamics, temperature, etc.).

A differential of several orders of magnitude has been observed: the protected surfaces give rise to solutions that are not detected or at lower limits of detection for measuring devices. The protection of the surfaces covered with the polyphosphazene film is therefore complete.

The protection of the surfaces could be shown by means of an XPS analysis of the surfaces subjected to a treatment process of coating with a polyphosphazene film. The XPS analysis (X-ray photoelectron spectroscopy for surface chemical analysis) provides an absolute chemical signature. With reference to FIG. 2, the signal representative of an InP surface covered with a polyphosphazene film (and with a pre-mask) of the type presented in the step S3 shown in FIG. 1A may consist of a combination of characteristic signals specific to:

nitrogen;
high-energy phosphorus;
carbon linked essentially to carbonaceous contamination and oxygen also linked to contamination of the polyphosphazene film during its exposure to air;

then to low energy phosphorus and to indium which in turn are linked to the response of the matrix of the InP alloy which passes through the film due to its nanometric thickness.

With reference to FIG. 2, the signals are entirely complementary along the line that includes a succession of masks, with all of these signals indeed reflecting the existence of a film covering a "buried" surface of InP which nevertheless remains visible. Thus, a film of nanometric thickness is indeed present.

Furthermore, the detection level of the matrix signal is a qualitative measurement tool for the thickness of the passivation film. In particular, the constancy of the XPS response over time has been observed and demonstrates a remarkable stability of the film in the presence of the acidic oxidising solution based on aqueous di-bromine, with this being in keeping with the lack of detection of dissolution products in solution on the protected samples over the entirety of the submerged surface.

The detection by means of XPS also makes it possible to show the total stability of the InP surface. The dissolved surface gives an XPS signature that is easily recognisable and identifiable with the growth of an oxide in a thin film which provides the contributions of phosphorus and especially of indium that are completely recognised and recorded. The analysis of the surfaces protected by the polyphosphazene shows a total absence of such signals linked to dissolution. The XPS analyses therefore provide two elements of proof of the total lack of reactivity to oxidising solutions on passivated surfaces.

The surfaces covered with polyphosphazene film are therefore completely protected from chemical etching, which makes polyphosphazene a material of choice for use as a chemical mask.

It should be noted that in general, polyphosphazene has been found to be stable at acidic pH (HBr and/or $H_2SO_4$), as also at basic pH (for example in the case of ferricyanide based attack), or neutral pH (for example in the presence of $H_2O_2$). It is therefore a material of choice for the masks involved in the chemical etching methods, ie by chemical attack (in particular by any oxidising solutions).

The use of a polyphosphazene film by way of an etching mask for chemical etching may be operationally implemented in the context of microelectronics and/or optoelectronics involving localized masks so as to generate on mirror localized etchings, localized passivations, bringing about of contact or growth which are also localized.

It has been shown here above that a new family of polyphosphazene-based masking materials is compatible with such applications.

In the "electroless" method or electrochemical method, zones of localized growth of polyphosphazene may be created by applying prior masking of the semiconductor surfaces by means of depositing of units, for example of silicon oxynitride $SiO_xN_y$.

Thus, with reference to FIG. 1A, during a first step S0, one obtains a surface of semiconductor SC (III-V or II-VI or other suitable semiconductor type) to be treated, for example cleaned in advance by chemical pickling, deoxidising, or other relevant process.

Then, in the step S1, it is possible for the pre-masks PM of SiOxNy to be deposited by selective zones according to techniques known per se for this type of masking material. These first level masks PM are compatible with liquid ammonia and the associated "electroless" treatment formulations. These masks are also compatible with the growth of polyphosphazene films by means of electrochemical mechanisms. Thus, in the step S2, the surface shown in the step S1 with the pre-masks PM is covered with liquid ammonia AL, on which the polyphosphazene PLP is deposited. At the end of the reaction, in the step S3, very thin films (of the order of a few nanometers) of polyphosphazene PLP are obtained that cover the surfaces of the semiconductor SC left exposed by the pre-masks PM. On the other hand, the polyphosphazene PLP has not been deposited on the pre-masks PM. In FIG. 1A in the step S3, the polyphosphazene film PLP is represented which has a thickness that is less than the thickness of the pre-masks PM based on SiOxNy. In reality, the polyphosphazene film PLP (a few nanometers) is much thinner than the pre-masks (a few micrometers). These complementary units of polyphosphazene PLP in the non-masked zones of the surface SC thus then form a "negative" masking. Thereafter, the selective elimination of the zone masked by SiOxNy may be carried out thereby exposing all the zones not covered with polyphosphazene.

Indeed, in the subsequent step S4, the pre-masks PM of SiOxNy may be removed by techniques known per se, such as immersion in hydrogen fluoride HF. Thus in the subsequent step S5, there remain only the zones covered with polyphosphazene between which the uncoated bare surface of the semiconductor SC is left exposed.

By way of a variant, the etching of completely covering polyphosphazene films may be carried out alternatively by means of electron or ion beam induced etching involving incident beams of electrons or ions or by means of laser etching which provide better lateral spatial resolutions.

Thus, relative to this second embodiment described here below and with reference to FIG. 1B, a first step S21 may consist in completely covering the surface of the semiconductor SC with liquid ammonia AL, then with polyphosphazene PLP with a view to the deposition of a thin film of the latter (measuring a few nanometers in thickness) over the entirety of the surface of the semiconductor SC as illustrated in the step S22 shown in FIG. 1B.

Then, in the step S23, a reactive beam, for example an electronic beam eB (or "eBeam"), or even an ion beam more generally, or indeed even a laser beam, is used in order to selectively etch by zones the polyphosphazene film. In the step S24, the etching exposes the bare surface of the semiconductor SC, while leaving the PLP polyphosphazene masks.

Then, in one or the other of the embodiments illustrated and discussed in detail here above with reference to FIGS. 1A and 1B respectively, a chemical attack HBr may be effected on the exposed zones of the semiconductor SC as illustrated in the step S31 shown in FIG. 1C. For example in the case where the semiconductor SC is constituted of a thin layer deposited on a substrate SUB (for example a glass substrate or metal substrate), the chemical attack can then eliminate the semiconductor SC in the non-covered zones and thereby render bare the substrate SUB as illustrated in the step S32 shown in FIG. 1C.

Quite obviously, the present invention is not limited to the embodiments described here above by way of examples; rather it may be extended to other variant embodiments.

Thus, for example, a description has been provided here above of a deposition method for depositing of the PLP mask, of the "electroless" type, which is preceded by an application of liquid ammonia. However, an alternative may consist in covering the zones of the surface of the semiconductor SC with an electrically insulating pre-mask, and thereafter applying an electrochemically induced deposition of the polyphosphazene, the latter coming to be deposited only on the zones of the surface of the semiconductor that are left exposed.

The invention claimed is:

1. A method for chemical etching a semiconductor material, the method including:
    a deposition of a mask on a first surface zone of the semiconductor material;
    an etching by chemical attack of a second surface zone of the semiconductor material that is not covered by the mask;
    wherein the mask is produced out of a material that comprises polyphosphazene; and
    wherein the deposition of the mask comprises a deposition of polyphosphazene by means of an electrochemical process.

2. The method according to claim 1, wherein the deposition of the mask includes a process of immersion in liquid ammonia followed by the deposition of polyphosphazene.

3. The method according to claim 1, wherein the deposition of the mask includes:
    a deposition of a removable pre-mask on the second surface zone of the semiconductor material;
    a deposition of polyphosphazene, and, with the polyphosphazene not adhering to the pre-mask; and
    a removal of the removable pre-mask so as to expose the second surface zone of the semiconductor material.

4. The method according to claim 3, wherein the pre-mask is produced from a material based on silicon oxynitride SiOxNy.

5. The method according to claim 3, wherein the removable pre-mask is removed by immersion in hydrogen fluoride solution.

6. The method according to claim 1, wherein the deposition of polyphosphazene is etched by a beam in order to form said mask covering the first surface zone.

7. The method according to claim 6, wherein the beam is an electron beam.

8. The method according to claim 1, wherein the etching is carried out by applying an oxidising solution.

9. The method according to claim 2, wherein the deposition of polyphosphazene is etched by a beam in order to form said mask covering the first surface zone.

* * * * *